United States Patent [19]

Ruelke

[11] Patent Number: 5,576,669
[45] Date of Patent: Nov. 19, 1996

[54] MULTI-LAYERED BI-DIRECTIONAL COUPLER

[75] Inventor: Charles R. Ruelke, Davie, Fla.

[73] Assignee: Motorola, Inc., Schaumburg, Ill.

[21] Appl. No.: 431,177

[22] Filed: Apr. 28, 1995

[51] Int. Cl.⁶ ..................................................... H01P 5/18
[52] U.S. Cl. ......................................... 333/116; 333/238
[58] Field of Search .............................................. 333/116

[56]     References Cited

U.S. PATENT DOCUMENTS

| 3,512,110 | 5/1970 | Clar ........................................ 333/116 |
| 4,809,356 | 2/1989 | Peckham et al. .................... 333/116 X |
| 5,424,694 | 6/1995 | Maloratsky et al. ................. 333/116 X |

OTHER PUBLICATIONS

Malherbe et al., *Directional Couplers Using Semi-Re-Entrant Coupled Lines*, Microwave Journal, Nov. 1987, pp. 121, 122, 124, 126 & 128.

Primary Examiner—Paul Gensler
Attorney, Agent, or Firm—Frank M. Scutch, III

[57]     ABSTRACT

A coupling device (100) for coupling RF energy on a transmission line (101) to a forward coupler (107) and a reverse coupler (113). The coupling device (100) includes a first coupling structure (121) and second coupling structure (125) which are parallel plate structures positioned a predetermined distance in a plane parallel to the transmission line (101), forward coupler (107) and reverse coupler (113). The first coupling structure (121) and second coupling structure (125) are used to increase the coupling coefficient and directivity of the forward coupler (107) and reverse coupler (113). One or more vias (139, 141) are used to connect forward coupler (107) and reverse coupler (113) to the first coupling structure (121) and the second coupling structure (125). The addition of the first coupling structure (121) and the second coupling structure (125) allow for a greater coupling efficiency without physically moving transmission line (101) towards either forward coupler (107) or reverse coupler (113).

28 Claims, 4 Drawing Sheets

MULTI-LAYERED BI-DIRECTIONAL COUPLER

TECHNICAL FIELD

This invention relates in general to two-way radios and more particularly to RF power coupling.

BACKGROUND

Coupling networks are well known in the art and are used in applications from audio to radars and wire taps. They are used to interconnect devices or subsystems and their functions. Coupling networks have applications in the 1) isolation of dc components; 2) shaping the amplitude or phase-angle transfer function; 3) impedance matching; and 4) real time direct control of causal feedback characteristics. In all cases, the coupler design depends not only upon the parameters of the coupling network, but also upon the specific circuit into which the coupling structure is imbedded.

In a typical radio frequency (RF) application, the directional coupler is used in the RF transmitter Automatic Level Control (ALC) circuit. The transmitter ALC senses the power level being produced by the RF Power Amplifier (RFPA) and adjusts the bias of the RFPA to set the RF power output to a desired level. A typical portable's ALC consists of the coupler which "lightly couples" RF energy from the main RF transmission line (between the RFPA and antenna), a rectifier which rectifies the coupled RF energy producing a dc voltage proportional to the RF power level, and a comparator which compares the rectified dc voltage to a reference voltage. The comparator's dc output is connected to the RFPA bias transistors and is adjusted to re-bias the RFPA to the proper power level. This application requires that the coupler induce low insertion loss in the main transmission path between RFPA and the antenna, while at the same time coupling enough energy into the ALC to be properly processed.

Moreover, the typical coupling structure can utilize broad edge or co-planar, microstrip or strip-line transmission structures. The prior art coplanar structure shown in FIG. 1 utilizes paired parallel transmission lines in the same horizontal (edge-to-edge) plane and functions predominantly as an inductive coupling (magnetic field) structure. As seen in FIG. 2, the broad edge coupling structure positions the coupling transmission line such that the width of the coupling transmission line "overlaps" the main transmission line along the vertical axis. The broad edge topology functions predominantly as a capacitive coupling (electric field) structure. In both the broad edge and coplanar topology, the primary RF transmission line is separated from the coupling transmission line by the appropriate distance to achieve the desired level of electro-magnetic coupling factor or coupling coefficient. A typical coupling factor of 20 dB will provide for proper ALC functionality with minimal insertion loss. For example, if 1 watt is being transmitted through the main transmission line, then 0.01 watt is being coupled onto the parallel transmission line. By definition, the microstrip transmission line structure uses air as the dielectric medium above the paired transmission lines. As seen in FIG. 3, the strip-line transmission structure is buried into any given dielectric material with ground planes "sandwiching" the dielectric encased coupler structure.

Multiple coupled line structures can be used to effect a bi-directional forward and/or reverse power coupling structure. FIG. 3 shows an example of a coupled line structure utilizing three lines. Forward and reverse (bi-directional) power coupling structures function as a dual mode topology to ensure both proper RFPA power levels and to cutback the RFPA power in the event of a fault in the transmitter system. The forward coupling transmission line senses the forward RF energy (power to the antenna); therefore, the dc voltage generated from the rectified forward coupled energy is directly proportional to the forward traveling RF energy. In the event of a transmitter system fault ( i.e. an open in the antenna) the RF energy is reflected back from the antenna towards the RFPA. Serious or catastrophic RFPA damage can result if the RFPA continues to transmit full power under a fault condition.

To protect against RFPA damage, a reverse power (power to the RFPA) cutback circuit using a reverse power coupling transmission line structure can be added to sense the level of reflected RF energy. As with the forward ALC topology, the reverse RF energy is rectified and the dc voltage from the reverse coupled structure is directly proportional to the reverse traveling RF energy. The bi-directional coupling factors can be independently set by variations in the geometries of the individual coupling transmission line and can be predicted using standard field solver techniques.

The electrical differentiation between the forward and reverse structure depends upon the placement of the termination impedances, control of the transmission line characteristic impedance and coupler separation from the primary transmission line. Directivity is a measure of the bi-directional coupler differentiation. The algebraic difference in dB of the forward and reverse coupling coefficients for any fixed structure is defined as the directivity of that structure. A 20 dB directivity factor is considered acceptable for a bi-directional coupler. This means that if a forward coupling structure measures a forward coupling coefficient of 20 dB, that the reverse coupling coefficient for that same structure will measure 40 dB; thus the directivity for the forward coupler is said to be 20 dB. The lower the directivity factor, the less sensitivity the ALC will have in differentiating between forward and reverse RF energies.

The coupler structure is critical to proper ALC functionality and protection of the RFPA. The bi-directional coupler design requires minimizing manufacturing tolerance effects and closed loop variations. PC board manufacturing variations in transmission line widths and inner-layer dielectric thicknesses have usually prevented the coupler from being embedded into the RF PCB (printed circuit board) itself. Historically, high performance bi-directional couplers have been fabricated on a substrate such as alumina, with thin film processes and their tight tolerance capability defining the coupler geometries to achieve a controlled 20 dB coupling coefficient with greater than 20 dB of directivity. Although the modularized approach to implementing the coupler is effective, it adds cost and process steps that could otherwise be eliminated if the coupler were to be embedded into the PCB itself. To achieve high reliability coupler performance with existing PCB make tolerances of ±2 mil gaussian width distributions requires an innovative design approach. Therefore, the need exists for embedded PCB coupler structure which achieves an acceptable coupling coefficient and directivity.

DETAILED DESCRIPTION OF THE PREFERRED EMBODIMENT

Figure 4:
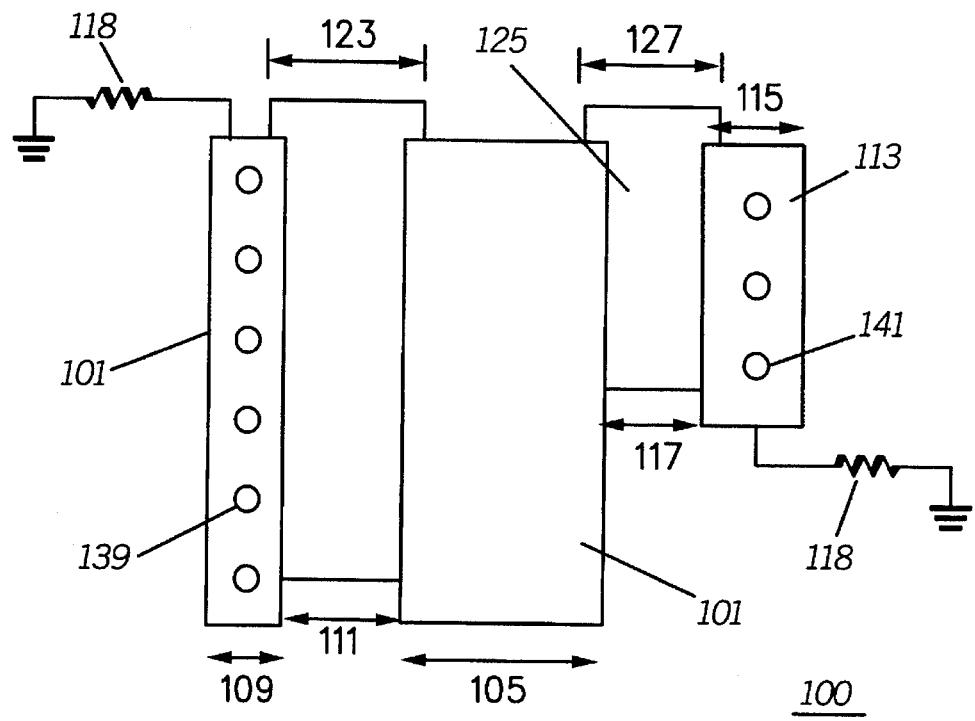
FIG. 4 is a top view of a multi-layered bi-directional microstrip coupler in accordance with the invention.
Figure 5:
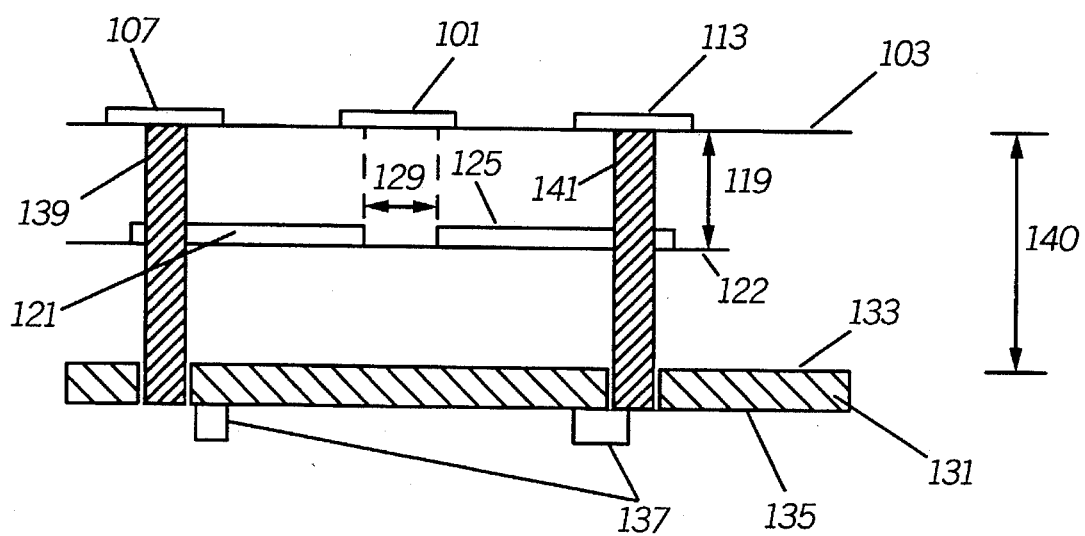
FIG. 5 is a side view of that shown in FIG. 4.

Referring now to FIGS. 4 and 5, a multi-element microstrip coupler structure 100 is a device for bi-directionally coupling RF energy and is shown as placed on a multi-layer printed circuit board. The microstrip coupler structure 100 includes a radio frequency (RF) transmission line 101 which is positioned upon first outer substrate 103. RF transmission line 101 has a specific width 105 and is generally attached to an RF source such as an RF power amplifier (not shown) which conveys RF energy at a specific frequency. The width 105, dielectric constant of the first outer substrate 103, and the distance 140 are those parameters which determine the characteristic impedance and velocity factor of the RF transmission line 101.

A forward power coupler 107 is positioned on the first outer substrate 103 adjacent to the RF transmission line 101. A forward power coupler 107 has a width 109 and is separated from the RF transmission line 101 by a distance 111. The width 109 and distance 111 determine the degree to which forward power coupler 107 is electro-magnetically coupled to the RF transmission line 101. The forward power coupler 107 is used to couple RF energy from RF transmission line 101 which is moving only in a forward or outwardly direction from the RF source (not shown).

Similarly, a reverse power coupler 113 is positioned on the opposite side of the RF transmission line 101 and has a width 115 and is separated from the RF transmission line 101 by a distance 117. The width 115 and distance 117 determines the degree to which reverse power coupler 113 is coupled to the RF transmission line 101. It should be recognized by those skilled in the art, the reverse power coupler 113 may be different in dimensions than the forward power coupler 107 because of specified design constraints requiring a different reverse coupling factor. However, if design requirements dictate, the function of the forward power coupler 107 and the reverse power coupler 113 can be reversed by relocating their respective termination impedances 118 to the opposite end of the affected transmission line. The composite coupling structure utilizing the forward power coupler 107, RF transmission line 101, and reverse power coupler 113 are positioned on the first outer substrate 103 and function as a coplanar bi-directional microstrip coupler.

Positioned below the first outer substrate 103 at a distance 119, a first coupling structure 121 is aligned on the inner substrate 122 between RF transmission line 101 and the forward power coupler 107. The first coupling structure 121 is essentially a flat conductive plate having a width 123 and works to increase the coupling coefficient and directivity between the RF transmission line 101 and the forward power coupler 107. The coupling coefficient and directivity are as defined above.

Similarly, a second coupling structure 125 is positioned adjacent to the first coupling structure 121 and is aligned on an inner substrate 122 between the RF transmission line 101 and a reverse power coupler 113. The second coupling structure 125 is also essentially a flat conductive plate having a width 127 and also works to increase directivity and coupling coefficient between the RF transmission line 101 and the reverse power coupler 113. The first coupling structure 121 and the second coupling structure 125 are oriented in substantially the same plane parallel to RF transmission line 101 and are separated on an inner substrate 122 a by distance 129. The composite coupling structures comprised of first coupling structure 121 and second coupling structure 125 function as a partial broad edge bi-directional coupler to transmission line 101 on the first outer substrate 103.

Located below the inner substrate 122, a second outer substrate 131 includes a conductive ground layer 133 on its inner side. The outer side 135 of the second outer substrate 131 is used to mount discrete components 137 which may be interconnected using surface runners (not shown) or the like. Finally, one or more vias 139 are used to connect the forward power coupler 107 to the first coupling structure 121. Thus, each via 139 must extend from the first outer substrate 103 through inner substrate 122 and may further extend to the second outer substrate 131. Each via 139 does not connect to the ground layer 133. Similarly, one or more vias 141 are used to connect reverse power coupler 113 to the second coupling structure 125. The vias 141 extend from the first outer substrate 103, through inner substrate 122 and may further extend to the second outer substrate 131 without connecting to the ground layer 133. It should be recognized by those skilled in the art, that via(s) 139 and via(s) 141 are shown as through hole vias but blind vias or buried vias could also be used.

Thus, the composite coupling structure functions as a hybrid combination of a coplanar and broad edge coupler embedded into the PC board with added components interconnecting the coupler to any supporting circuitry. Assuming standard fire-retarding expoxy resin/glass cloth laminate (FR4) material is used in the construction of the printed circuit board, typical widths and distances for the microstrip coupler structure 100 range between 20 mils and 180 mils depending on specific design requirements and printed circuit board parameters.

Figure 6:
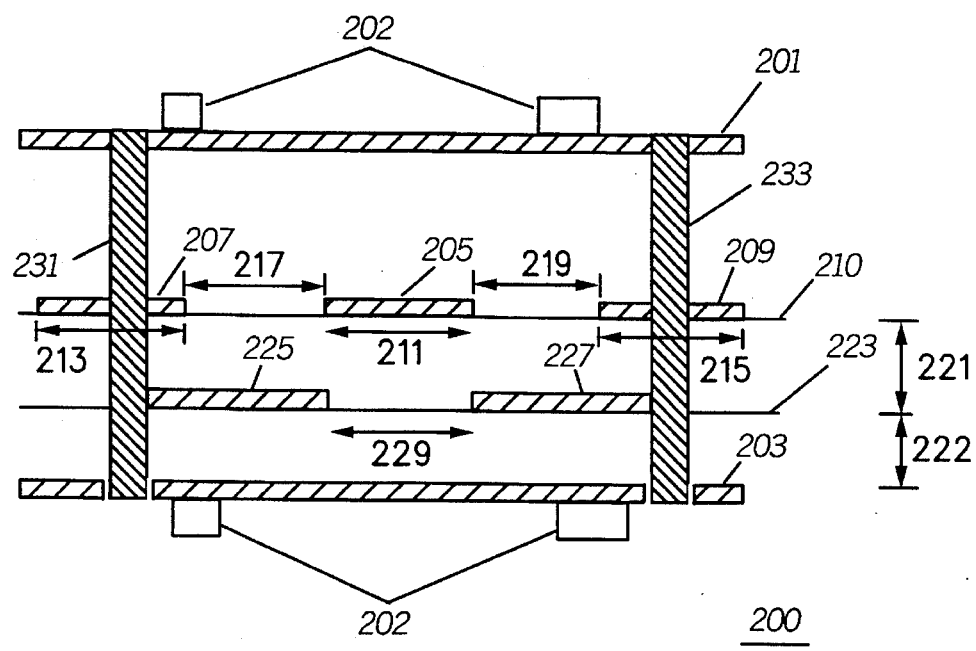
FIG. 6 is a side view of a multi-layered bi-directional stripline coupler using lower parallel plate structures in accordance with an alternative embodiment of the invention.

In yet another embodiment shown in FIG. 6, a stripline coupler structure 200 includes a first outer ground layer 201 and a second outer ground layer 203. The microstrip coupler structure 100 differs from the stripline coupler structure 200 due to the presence of the first outer ground layer 201 and the second outer ground layer 203 exterior to or sandwiching the coupling transmission lines. The outer ground plates on the respective ground layers act to isolate the coupling structure from extraneous RF sources that may degrade coupling performance. Any number of component parts 202 may be positioned on the outer surface of both the first outer ground layer 201 and second outer ground layer 203.

The stripline coupler structure 200 further includes an RF transmission line 205, forward power coupler 207 and a reverse power coupler 209 each positioned on a first substrate 210. RF transmission line 205 has a width 211, forward power coupler 207 has a width 213 and reverse power coupler 209 has a width 215. The width 211 is used to control impedance and velocity factor of the RF transmission line 205 while the width 213 and width 215 are used to control the respective coupling coefficient of the forward power coupler 207 and reverse power coupler 209. The forward power coupler 207 is separated from the RF transmission line 205 by a distance 217 while reverse power coupler 209 is separated from RF transmission line 205 by distance 219. Distance 217 and distance 219 also control coupling coefficient and directivity of each respective coupler.

Positioned at a distance 221 below the first substrate 210 and at a distance 222 above the second outer ground layer 203, a second substrate 223 is used to align a first coupling structure 225 between the RF transmission line 205 and the forward power coupler 207. A second coupling structure 227 is also aligned below RF transmission line 205 and reverse power coupler 209. Both the first coupling structure 225 and second coupling structure 227 function as broad edge couplers to the RF transmission line 205 and are used to increase directivity and coupling factor. The first coupling structure 225 and the second coupling structure 227 are separated by a distance 229 designed to minimize undesired coupling between these structures.

Finally, one or more vias 231 are used to connect the forward power coupler 207 to the first coupling structure 225. Thus, each via 231 extends from the first outer ground layer 201 through first substrate 210, second substrate 223 to the second outer ground layer 203. Each via 231 connects the forward power coupler 207 to the first coupling structure 225. Similarly, one or more vias 233 are used to connect reverse power coupler 209 to the second coupling structure 227. The vias 233 extend from the first outer ground layer 201, through the first substrate 210 and second substrate 223 connecting to these structures.

Figure 7:
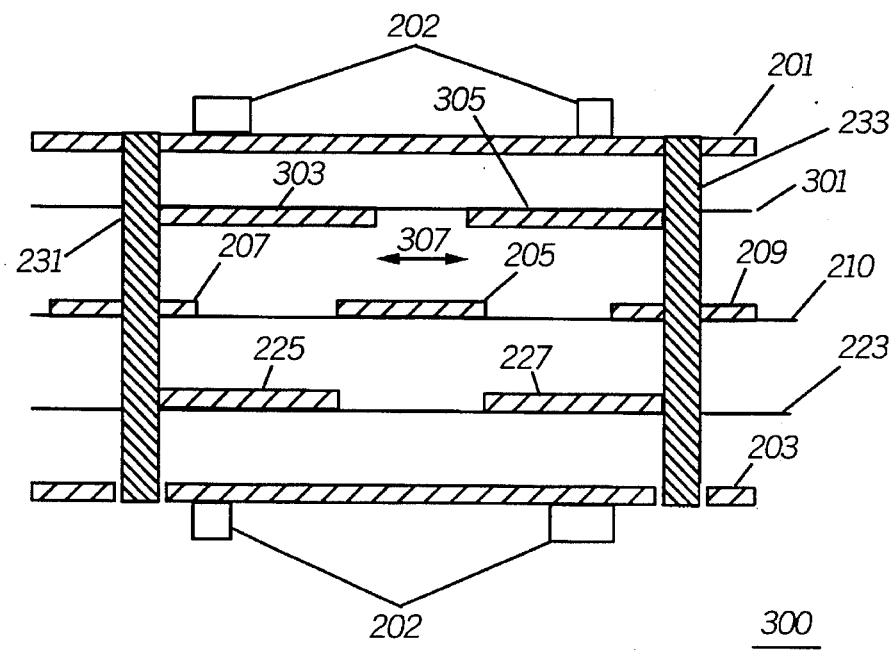
FIG. 7 is a side view of a multi-layered bi-directional stripline coupler using upper and lower parallel plate structures in accordance with an alternative embodiment of the invention.

FIG. 7 shows another embodiment of a stripline coupler structure 300. All components are identical except for the addition of a third substrate 301 which is located above or adjacent to first substrate 210. Positioned on third substrate 301 are third coupling structure 303 and fourth coupling structure 305 which provide additional coupling from RF transmission line 205 to forward power coupler 207 and reverse power coupler 209. Third coupling structure 303 and fourth coupling structure 305 axe separated by a distance 307.

Figure 1:
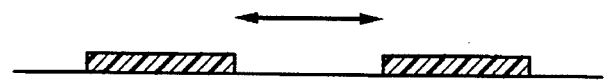
FIG. 1 is a side view of a coplanar coupled transmission line pair.
Figure 2:
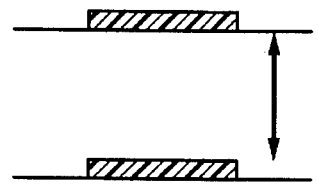
FIG. 2 is a side view of a broad edge coupled transmission line pair.
Figure 3:
FIG. 3 is a side view of a conventional coplanar bi-directional stripline coupler.
Figure 3:
Figure 3:
Figure 8:
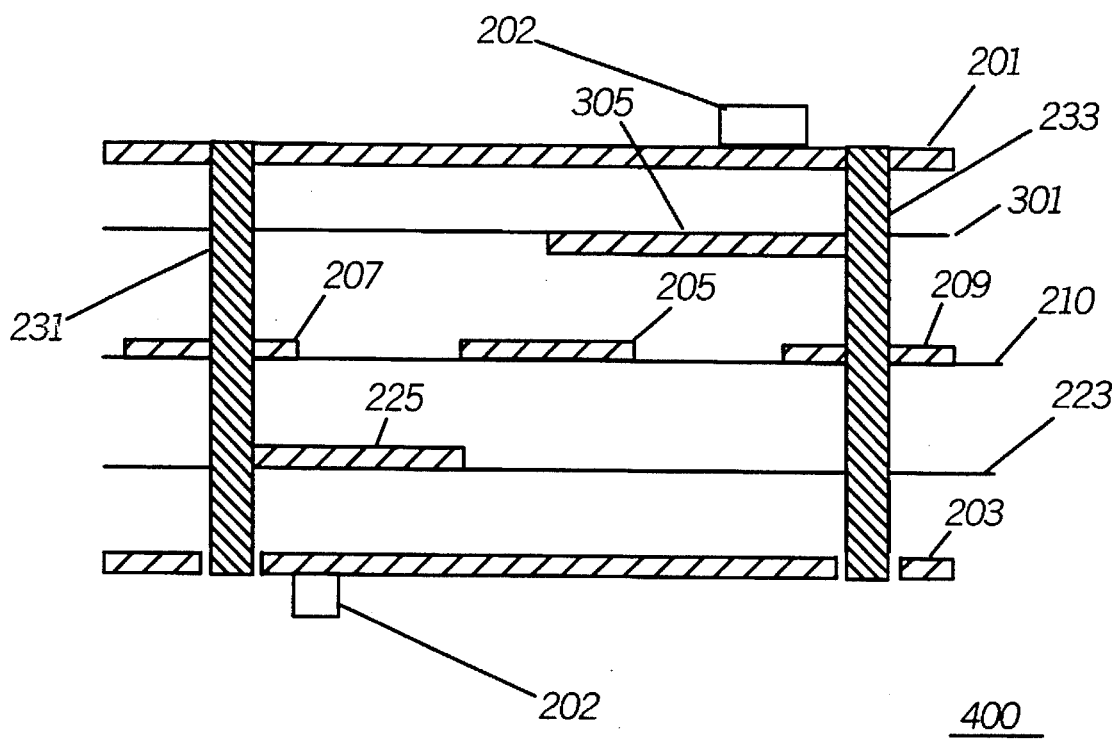
FIG. 8 is a side view of a multi-layered bi-directional stripline coupler using upper and lower parallel plate structures which are toggled in accordance with an alternative embodiment of the invention.

FIG. 8 shows yet another embodiment of a stripline coupler structure 400. In this configuration, the first coupling structure 225 and fourth coupling structure 305 are used in a toggle or staggered formation. This configuration may be used over that shown in prior art FIGS. 1 and 2 to provide the desired amount of coupling between the RF transmission line 205, forward power coupler 207 and reverse power coupler 209. It should be evident to those skilled in the art that second coupling structure 227 and third coupling structure 303 may be used in a toggle configuration as well. It should also be recognized by those skilled in the art that while the preceding discussion is predominately concerned with bi-directional coupler structures, a similar hybrid uni-directional coupler may also be constructed utilizing the same principles by eliminating the unnecessary coupling transmission lines.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A device for bi-directionally coupling RF energy from a transmission line to a plurality of couplers comprising:

at least one transmission line for carrying energy from a radio frequency (RF) source;

at least one forward coupler positioned a predetermined distance adjacent to said at least one transmission line for coupling said RF energy moving in a first direction;

at least one reverse coupler positioned a predetermined distance adjacent to said at least one transmission line for coupling said RF energy traveling in a second direction;

a first parallel plate positioned below said at least one transmission line and said at least one forward coupler for increasing the coupling coefficient and directivity between said at least one transmission line and said at least one forward coupler;

a second parallel plate positioned below said at least one transmission line and said at least one reverse coupler for increasing the coupling coefficient and directivity between said at least one transmission line and said at least one reverse coupler;

a ground layer positioned below said first parallel plate and said second parallel plate; and a plurality of vias for connecting said at least one forward coupler with said first parallel plate and said at least one reverse coupler with said second parallel plate.

2. A device as in claim 1 wherein the at least one transmission line, at least one forward coupler, and at least one reverse coupler are a microstrip.

3. A device as in claim 1 wherein the at least one transmission line, at least one forward coupler, and at least one reverse coupler are a stripline.

4. A multi-element bi-directional coupler used with a multi-layer printed circuit board comprising:

a first coupling structure connected to a radio frequency source;

a second coupling structure positioned adjacent to said first coupling structure for coupling RF energy moving in a forward direction from said first coupling structure;

a third coupling structure positioned adjacent to said first coupling structure for coupling RF energy moving in a reverse direction on said first coupling structure;

a first coupling plate positioned below said first coupling structure and said second coupling structure for capacitively coupling energy from said first coupling structure to said second coupling structure;

a second coupling plate positioned below said first coupling structure and said third coupling structure for capacitively coupling energy from said first coupling structure to said third coupling structure;

a ground layer positioned below said first coupling plate and said second coupling plate for providing isolation;

a plurality of first vias for connecting said second coupling structure with said first coupling plate; and a plurality of second vias for connecting said third coupling structure with said second coupling plate.

5. A multi-element bi-directional coupler according to claim 4 wherein said first coupling structure is a RF transmission line.

6. A multi-element bi-directional coupler according to claim 5 wherein said RF transmission line is a stripline.

7. A multi-element bi-directional coupler according claim 5 wherein said RF transmission line is a microstrip.

8. A multi-element bi-directional coupler according to claim 4 wherein said second coupling structure is a forward power coupler.

9. A multi-element bi-directional coupler according to claim 8 wherein said third coupling structure is an reverse power coupler.

10. A multi-element bi-directional coupler according to claim 4 wherein said first coupling plate is positioned in a plane parallel with said first coupling structure.

11. A multi-element bi-directional coupler according to claim 4 wherein said second coupling plate is in a plane parallel with said first coupling structure.

12. A radio frequency (RF) power coupling device comprising:
   at least one transmission line for conducting RF energy;
   a first coupler positioned adjacent said at least one transmission line for coupling said RF energy traveling on said at least one transmission line in a forward direction;
   a second coupler positioned adjacent said at least one transmission line for coupling said RF energy traveling on said at least one transmission line in a reverse direction;
   at least one first coupling structure positioned a predetermined distance from said at least one transmission line, first coupler and the second coupler for increasing coupling between said at least one transmission line and first coupler;
   at least one first via for interconnecting said first coupler with said at least one first coupling structure;
   a first ground layer positioned adjacent said at least one transmission line for isolating said at least one transmission line and said at least one first coupling structure; and
   a second ground layer positioned adjacent said at least one first coupling structure for isolating said at least one first coupling structure and said at least one transmission line.

13. A radio frequency power coupling device as in claim 12 wherein said at least one transmission line, first coupler and second coupler are planar structures.

14. A radio frequency power coupling device as in claim 12 wherein said at least one transmission line, first coupler and second coupler are a microstrip.

15. A radio frequency power coupling device as in claim 12 wherein said at least one transmission line, first coupler and second coupler are a stripline.

16. A radio frequency power coupling device as in claim 12 further comprising:
   at least one second coupling structure positioned a predetermined distance from said at least one transmission line, first coupler and second coupler for increasing coupling between said transmission line and said second coupler and;
   at least one second via for interconnecting said second coupler with said at least one second coupling structure.

17. A radio frequency power coupling device as in claim 16 wherein said at least one first coupling structure and said at least one second coupling structure are planar.

18. A radio frequency power coupling device as in claim 16 wherein said at least one first coupling structure and said at least one second coupling structure each are comprised of a conductive plate oriented in a first plane parallel with said at least one transmission line.

19. A radio frequency power coupling device as in claim 18 wherein said at least one second coupling structure is comprised of a conductive plate oriented in said first plane parallel with said at least one transmission line.

20. A radio frequency power coupling device as in claim 16 wherein said transmission line, first coupler and second coupler are positioned on a first substrate.

21. A radio frequency power coupling device as in claim 20 wherein said at least one first coupling structure is positioned on a second substrate.

22. A radio frequency power coupling device as in claim 21 wherein said second coupling structure is positioned on a third substrate.

23. A radio frequency power coupling device as in claim 22 wherein said second substrate and said third substrate are asymmetrically positioned a predetermined distance from said first substrate.

24. A method of increasing the coupling coefficient of a bi-directional coupler device which includes at least one transmission line and at least one parasitic coupling device comprising the steps of:
   positioning a coupling structure in a parallel plane with said transmission line and said at least one parasitic coupling device;
   aligning said coupling structure at a predetermined distance from said at least one transmission line and said coupling device so said coupling structure occupies an area in said parallel plane which is substantially between said transmission line and said coupling device; and
   electrically interconnecting the at least one parasitic coupling device and coupling structure using at least one via.

25. A method as in claim 24 wherein said at least one parasitic coupling device is a foward power coupler.

26. A method as in claim 24 wherein said at least one parasitic coupling device is a reverse power coupler.

27. A method as in claim 24 wherein said at least one transmission line and at least one parasitic coupling device are a microstrip.

28. A method as in claim 24 wherein said at least one transmission line and at least one parasitic coupling device are a stripline.

* * * * *